United States Patent
Wang et al.

(10) Patent No.: US 9,768,370 B2
(45) Date of Patent: Sep. 19, 2017

(54) LOW AC LOSS HIGH TEMPERATURE SUPERCONDUCTOR TAPE

(71) Applicant: Varian Semiconductor Equipment Associates, Inc., Gloucester, MA (US)

(72) Inventors: Connie P. Wang, Mountain View, CA (US); Paul Sullivan, Wenham, MA (US); Paul Murphy, Reading, MA (US); Kasegn D. Tekletsadik, Middleton, MA (US); Bharatwaj Ramakrishnan, Fremont, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 547 days.

(21) Appl. No.: 14/029,351

(22) Filed: Sep. 17, 2013

(65) Prior Publication Data
US 2015/0348680 A1    Dec. 3, 2015

(51) Int. Cl.
*H01L 39/24* (2006.01)
*H01L 39/18* (2006.01)
*H01L 39/14* (2006.01)

(52) U.S. Cl.
CPC ........... *H01L 39/18* (2013.01); *H01L 39/143* (2013.01); *H01L 39/2464* (2013.01)

(58) Field of Classification Search
CPC .... H01B 12/06; H01B 13/0036; H01L 39/143

USPC .......................................................... 505/230
See application file for complete search history.

(56) References Cited

U.S. PATENT DOCUMENTS

| | | | |
|---|---|---|---|
| 5,096,882 A * | 3/1992 | Kato | H01F 6/06 204/157.41 |
| 2007/0191202 A1* | 8/2007 | Foltyn | H01L 39/248 501/12 |
| 2010/0210468 A1* | 8/2010 | Lee | H01L 39/02 505/410 |
| 2011/0319271 A1* | 12/2011 | Selvamanickam et al. | 505/231 |

OTHER PUBLICATIONS

V. Selvamanickam, et al., Progress in SuperPower's 2G HTS Wire Development and Manufacturing, DO Advanced Cables & Conductors Peer Review, 2010, pp. 1-61.

* cited by examiner

*Primary Examiner* — Paul Wartalowicz (57) ABSTRACT

A superconductor tape includes a plurality of conductive strips having respective long directions parallel to a long tape direction of the superconductor tape, where each of the plurality of conductive strips separated from one another by a inter-strip region. The superconductor tape further includes a superconductor layer disposed adjacent the plurality of conductive strips, having a length along the long tape direction, where the superconductor layer comprises a plurality of superconductor strips disposed under the respective plurality of conductive strips, and a non-superconductor strip disposed adjacent the inter-strip region.

10 Claims, 8 Drawing Sheets

LOW AC LOSS HIGH TEMPERATURE SUPERCONDUCTOR TAPE

FIELD

The present embodiments relate to superconducting materials and, more particularly, to superconducting tape and fabrication techniques therefore.

BACKGROUND

Superconducting wires or tapes have been developed based upon high temperature superconducting (HTc or HTS) materials which may have critical temperatures $T_C$ above 77 K, facilitating their use in cryogenic systems cooled by liquid nitrogen. In particular, superconducting tapes have been developed in which a layer of superconducting material is integrated into a stack of conductive and/or non-conductive layers that form the tape.

When used to conduct alternating current (AC) a superconducting tape generates a magnetic field along the edges of the superconducting tape. When the polarity of current in the superconducting tape switches with the AC signal, magnetic flux switches polarity and exhibits a hysteretic behavior (Hp), which contributes to an energy loss that is often termed "AC loss." The AC loss depends upon the aspect ratio of the superconducting tape in which the aspect ratio is defined as the thickness of the superconducting layer divided by the width of the superconducting tape. In particular, as the aspect ratio decreases, the magnetic hysteresis and AC loss increases. A typical superconducting tape may have a width of about 1 cm and superconducting layer thickness of about 1 μm, thereby exhibiting an extremely low aspect ratio. Although attempts have been made to improve the aspect ratio by etching superconductor tape to form narrower superconducting lines, such processes may not be ideally suited to high volume manufacturing. It is with respect to these and other considerations that the present improvements are needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a superconductor tape includes a plurality of conductive strips having respective long directions parallel to a long tape direction of the superconductor tape, where each of the plurality of conductive strips separated from one another by a inter-strip region. The superconductor tape further includes a superconductor layer disposed adjacent the plurality of conductive strips, having a length along the long tape direction, where the superconductor layer comprises a plurality of superconductor strips disposed under the respective plurality of conductive strips, and a non-superconductor strip disposed adjacent the inter-strip region.

In an additional embodiment, a method form a superconductor tape includes forming a superconductor layer comprising a superconductor material on a tape substrate layer, the tape substrate layer having a long tape direction; forming a plurality of conductive strips on the superconductor layer, the conductive strips having respective long directions parallel to the long tape direction, the plurality of conductive strips separated from one another by at least one inter-strip region that defines respective one of an exposed superconductor region; and treating the exposed superconductor region to render the exposed superconductor region into non-superconductor material.

DETAILED DESCRIPTION

The present embodiments will now be described more fully hereinafter with reference to the accompanying drawings, in which some embodiments are shown. This subject matter, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

To address some of the deficiencies in the aforementioned superconductor tapes, embodiments are described herein that provide improved structure for superconductor tapes as well as improved techniques for forming superconductor tapes. These embodiments may be especially suited to applications of superconductor tapes in which the tapes are subject to an AC voltage including in fault current limiters and other applications.

To address this situation, the present embodiments in particular provide techniques to generate a superconductor tape configuration that imparts an effectively lower aspect ratio to the superconductor tape. The resultant superconductor tapes maintain the superconducting layer intact unlike in earlier approaches. The terms "superconductor" "superconductor element" or "superconductor material" as used herein, refer to a substance or object that has the capability of conducting electrical current without resistance. Thus a material such as $YBa_2Cu_3O_{7-x}$ (also referred to herein as "YBCO") may be referred to a superconductor or superconductor material even when subject to a room temperature environment in which the material is not superconducting, since YBCO does become superconducting at temperatures below about 91 K.

The term "superconducting" or "superconducting layer" on the other hand, are used herein to refer to properties of a tape or material. Thus, YBCO is superconducting under certain conditions, such as temperatures below 91 K or when current conducted by the YBCO material is below a critical current. Moreover, the term "non-superconducting" and "non-superconducting state" as used herein both refer to the state of a superconductor material in which the superconductor material does not have superconducting properties, such as when the superconductor material is subject to room temperature ambient.

In addition, the term "non-superconductor" as used herein, may refer to a material that is not capable of being superconducting. For example, a non-superconductor may include a material derived from a superconductor material such as YBCO, in which the material is altered, either chemically or structurally, from the parent superconductor material in a manner to render it incapable of becoming superconducting. Thus, a superconductor material may exist in superconducting state or non-superconducting state depending on conditions including temperature, electrical current density for current being conducted by the superconductor material, and the magnetic field applied to the material, etc. A non-superconductor material, on the other hand, may exist in a non-superconducting state regardless of temperature or other factors.

Finally, the terms "superconductor tape" and "superconductor layer" as used herein refer to a tape or layer in which at least a portion of the respective tape or layer contains a superconductor material. Thus, a "superconductor tape" may include one or more regions of superconductor material and optionally one or more regions of non-superconductor material.

Figure 1:
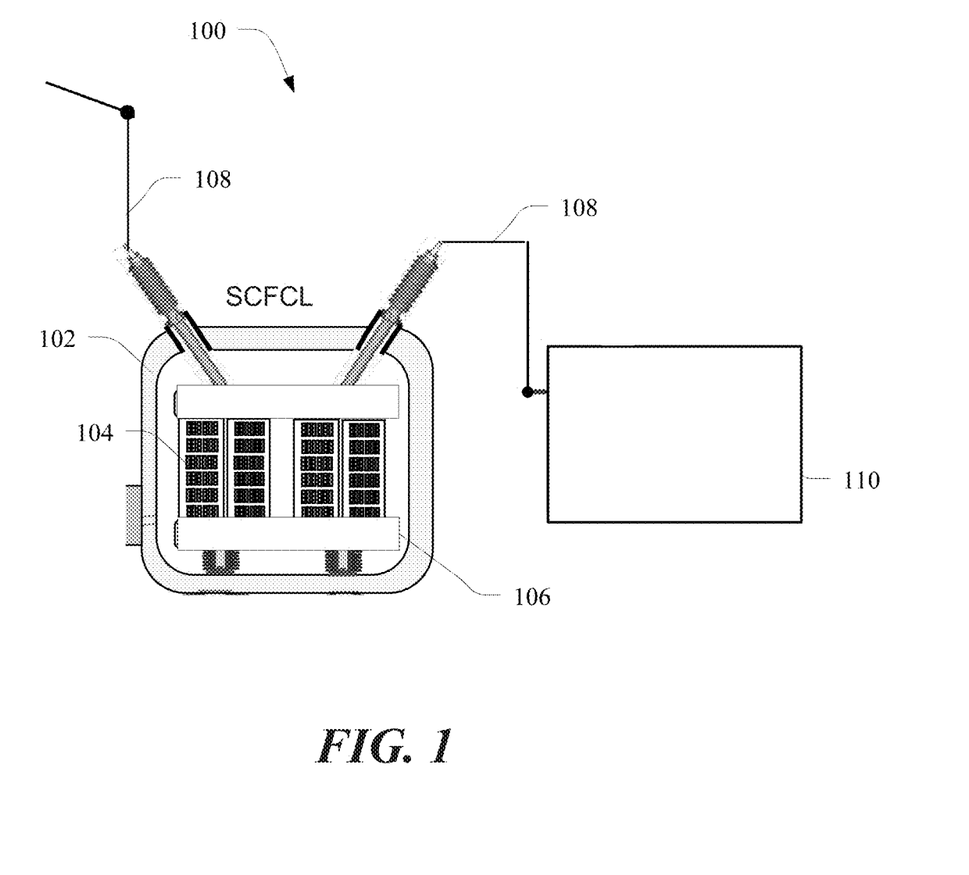
FIG. 1 depicts a current limiting system in accordance with one embodiment.

FIG. 1 depicts an architecture of a superconductiong fault current limiter (SCFCL) system 100 consistent with embodiments of the disclosure. The SCFCL system 100 includes an SCFCL 102, which may be a conventional SCFCL except as otherwise noted herein with respect to the description to follow. The SCFCL system further includes a protection element 106 that contains superconducting tapes arranged according to various embodiments. The SCFCL 102 is arranged in series with a transmission line 108 that conducts AC current generated by an AC source 110. In operation, the SCFCL system 100 provides fault current protection by limiting fault current (not separately shown) that may develop along the transmission line 108. Under normal operation mode an AC load current may periodically, occasionally, or continuously pass through the SCFCL system 100. The AC load current in normal operation mode exhibits a current level such that the superconductor elements 104 remain in a superconducting state and therefore transmit the load current through the superconductor elements 104 with zero resistance when the load current passes through the SCFCL 102. Accordingly, the load current is transmitted with relatively lower resistance through the SCFCL, which includes resistive points including normal state metals and connection points. During a fault condition in which an excessive fault current may be rapidly generated, the superconductor elements 104 react to the excessive fault current by transforming from a superconducting state to a non-superconducting state, which places a large overall impedance to the excessive fault current, thereby limiting the fault current during the fault condition. Subsequently, the superconductor elements 104 may return to a superconducting state to regulate current by limiting current in future fault events.

Consistent with the present embodiments the superconductor elements 104 include superconductor tape having a novel structure that facilitates a reduction in AC loss by decreasing the aforementioned magnetic hysteresis that develops in response to conduction of alternating current through the superdonductor tape. In this manner the SCFCL operates more efficiently in normal operation.

In particular embodiments as detailed below the magnetic hysteresis may be reduced up to about 70% or so as compared to conventional superconductor tapes. This is accomplished by subdividing a superconductor layer of a superconductor tape into a plurality of superconductor strips that are isolated from one another so as to increase the effective aspect ratio of superconductor portions of the superconductor tape. Advantageously, as detailed below the present embodiments provide robust techniques to fabricate this subdivided structure consistent with high volume manufacturing.

Figure 2:
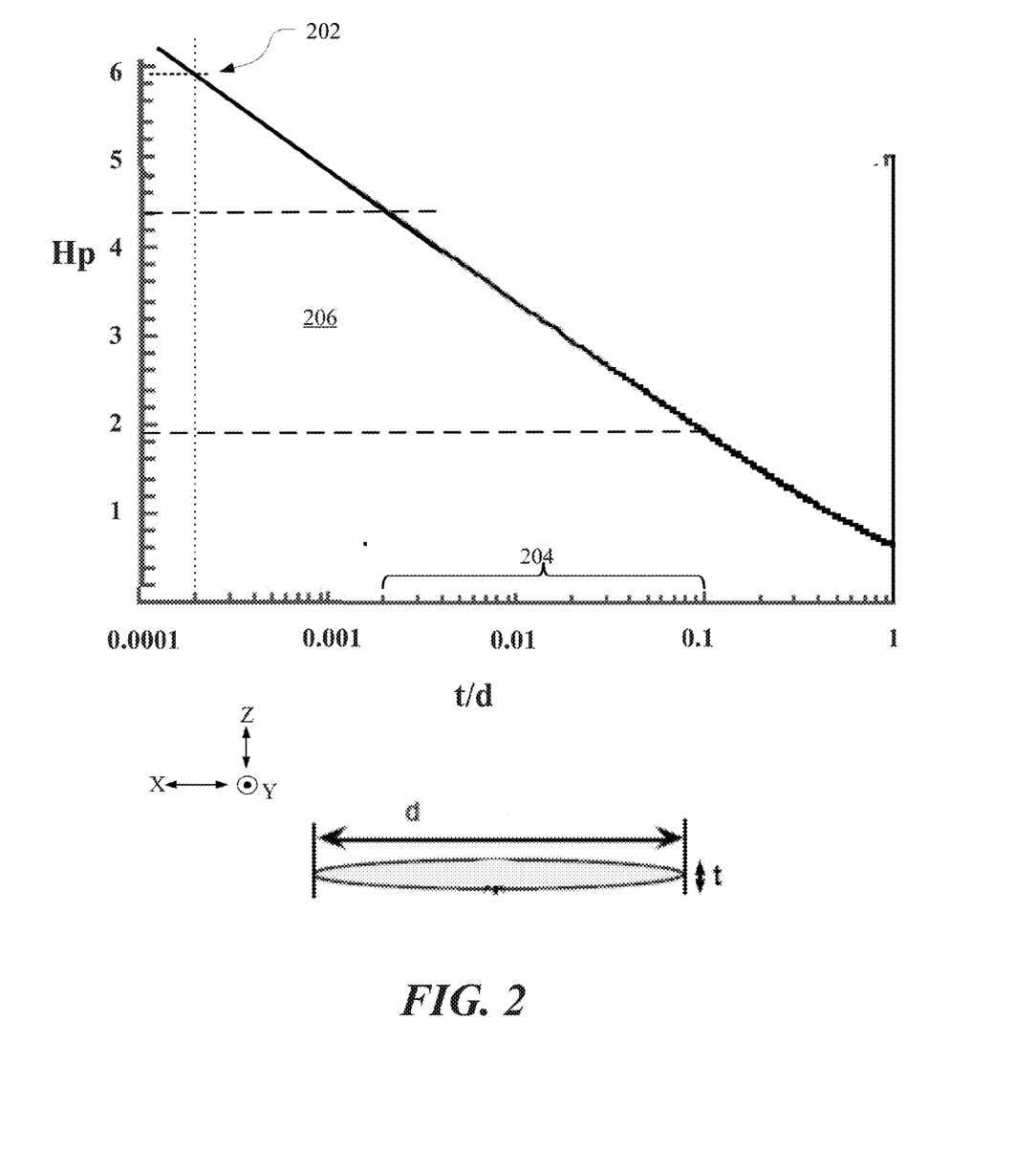
FIG. 2 depicts a magnetic hysteresis in superconducting tapes as a function of tape aspect ratio.

FIG. 2 illustrates the improved properties of superconductor tapes afforded by the present embodiments. In particular, there is illustrated the general relationship between magnetic hysteresis ($H_P$) induced by an AC current in the superconductor tape and the aspect ratio of the superconductor tape. The value of $H_P$ is proportional to the AC loss and it is therefore desirable to minimize $H_P$. As illustrated, the aspect ratio is defined by the height or thickness (t) divided by a width d of a cross section of the superconductor element (layer). With reference to the Cartesian coordinate system shown h is the superconductor layer dimension along the Y direction, d is the superconductor layer dimension along the X direction, and AC current flows into or out of the page along the length of the superconductor tape parallel to the Z-direction. Conventional superconductor tapes have typical widths (d) on the order of one centimeter, such as about 1 or 2 cm, and have thickness t on the order of one micrometer, such as about 0.5-2 µm. This imparts an aspect ratio t/d of about 0.000025 to about 0.0002 for a conventional superconductor tape. Even at the "high" aspect ratio of 0.0002 shown by the vertical dotted line in FIG. 2, the relative level 202 of $H_P$ is about 6. In contrast the present embodiments provide a superconductor tape divided into a plurality of superconductor regions having widths that are much narrower than the overall tape width. In various embodiments, a superconductor tape is divided into one or more superconductor strips in which the strip width ($d_S$) is much narrower than the overall tape width, thereby reducing the aspect ratio t/d for any given superconductor path (strip), where d=$d_S$. For example, in some implementations the value of $d_S$ may range between about 20 µm and 500 µm. This leads to aspect ratios over the range 204 for typical superconductor layer thickness in the range of 0.5 to 2.0 µm. In turn the range 204 corresponds to relative $H_P$ values in a range 206 of between about 4.5 and 2 for the scale used in FIG. 2, which corresponds to a reduction in magnetic hysteresis of about 25% to 67%. The values shown in FIG. 2 are merely exemplary and the embodiments are not limited in this context.

Figure 3A:
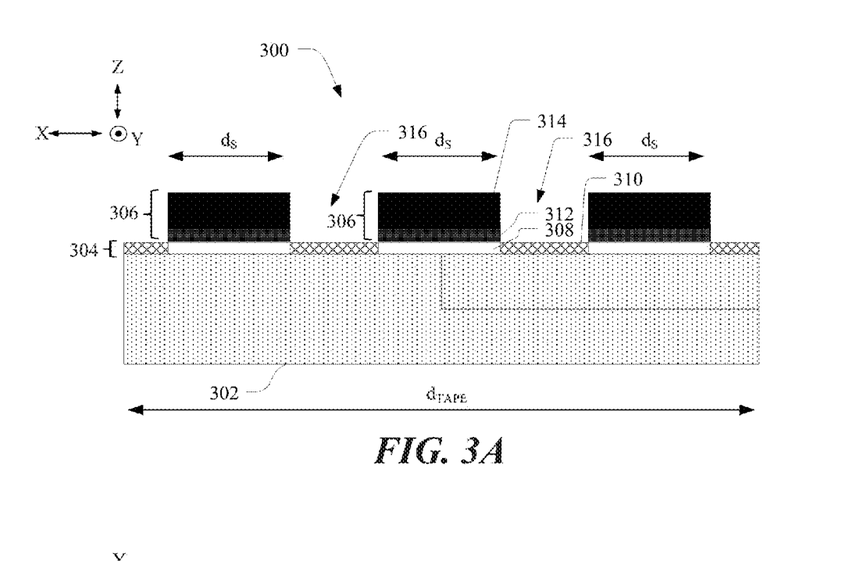
FIG. 3A depicts an end cross-sectional view of an embodiment of a superconductor tape.
Figure 3B:
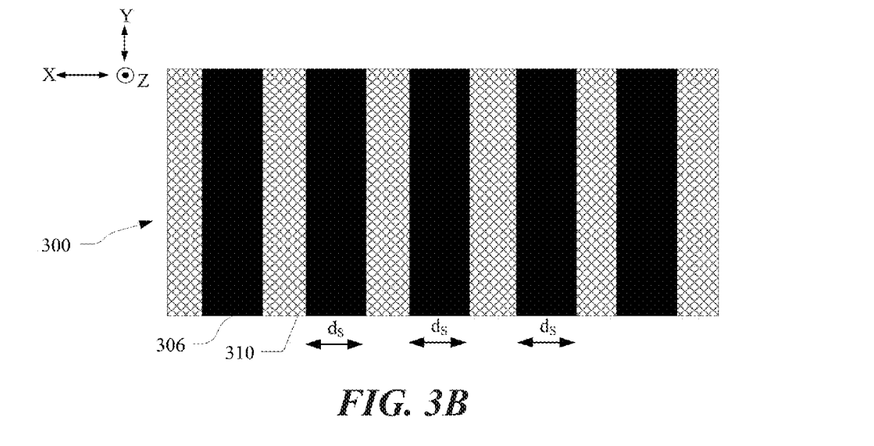
FIG. 3B depicts a top plan view of the superconductor tape of FIG. 3A.
Figure 4:
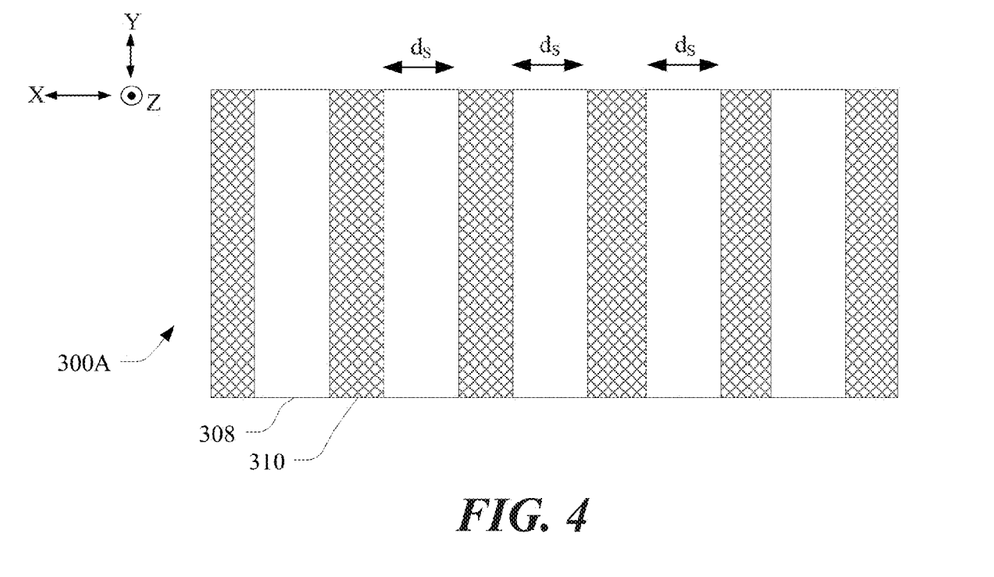
FIG. 4 depicts a top plan view of the superconductor tape of FIG. 3B with a conductive strip layer removed for clarity.

FIG. 3A depicts an end cross-sectional view of one embodiment of a superconductor tape 300 having a plurality of isolated superconductor strips. The cross-sectional view is perpendicular to the long direction of the tape and therefore perpendicular to the direction of current flow. FIG. 3B depicts a top plan view of the superconductor tape of FIG. 3A. FIG. 4 depicts a top plan view of the superconductor tape of FIG. 3B with a conductive strip layer removed for clarity. As illustrated in the FIGS., the superconductor strips 308 are formed on a substrate 302.

Figure 5A:
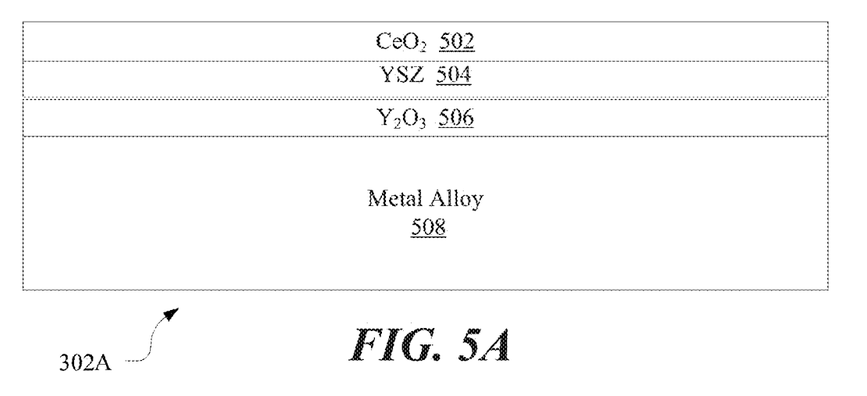
FIG. 5A depicts one embodiment of substrate layers of a superconductor tape.
Figure 5B:
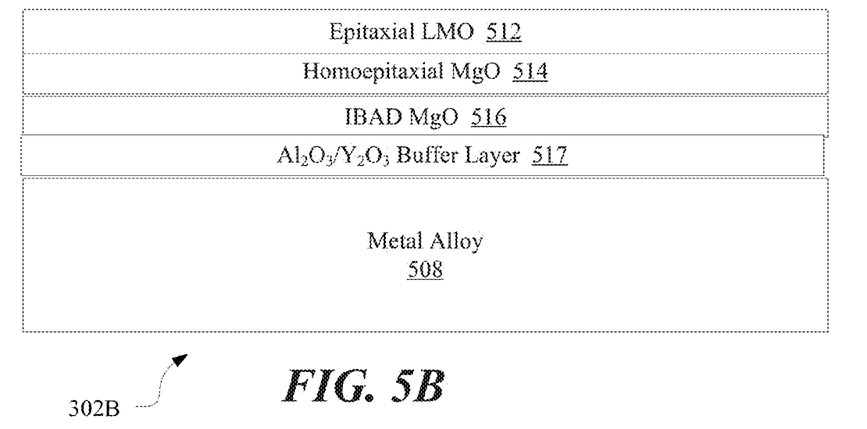
FIG. 5B depicts another embodiment of substrate layers of a superconductor tape.

FIG. 5A depicts one embodiment of substrate layers and FIG. 5B depicts another embodiment of substrate layers of a superconducting tape, each of which represent variants of the substrate 302. The embodiments are not limited in this context. For example, referring to FIG. 5A, the substrate 302A includes a base metal alloy layer 508, $Y_2O_3$ layer 506 disposed on the base metal alloy layer 508, yttrium stabilized zirconia (YSZ) layer 504 disposed upon the $Y_2O_3$ layer 506, and $CeO_2$ layer 502 diposed upon the YSZ layer 504. The $CeO_2$ layer 502 represents the layer upon which the superconductor layer 304 is disposed. In the example of FIG. 5B, the substrate 302B includes a base metal alloy layer 508, $Al_2O_3/Y_2O_3$ Buffer Layer 517, MgO layer formed by ion beam-assisted deposition (IBAD MgO 516), homoepitaxial MgO layer 514 disposed the IBAD MgO 516, and epitaxial $LaMnO_3$ (LMO)) layer 512. The epitaxial LMO layer 512 represents the layer upon which the superconductor layer 304 is disposed. Notably, the embodiments are not limited to the specific layer stacks depicted in FIGS. 5A and 5B.

Referring again to FIGS. 3A and 3B, the superconductor layer 304 includes a plurality of superconductor strips 308 that run parallel to a long direction of the superconductor tape (Y-direction) and are separated by non-superconducting strips 310. Disposed on the plurality of superconductor strips 308 are a respective plurality of conductive strips 306. Multiple conductive strips 306, which may have a strip width $d_S$ that is about 20 µm to about 500 µm in various embodiments, may be formed within a superconductor tape 300 whose tape width $d_{TAPE}$ is about 0.5 to 5 µm. In various embodiments the superconductor tape including the conductive strips 306 and superconductor strips 308 may extend for many hundreds of centimeters or many meters along the Y-direction. It is to be noted that in operation the superconductor tape 300 may be bent or curved such that the absolute direction of what is shown as the Y-direction with respect to a fixed coordinate system may vary. However, in all portions of a superconductor tape current may be conducted parallel to the instantaneous Y-direction.

The conductive strips 306 may include multiple layers such as in a conventional superconductor tape structure. In one example the conductive strip 306 includes an underlayer 312 made of silver that contacts the superconductor strip 308, and an overlayer 314 made of copper. In operation, under normal conditions, the superconductor strips 308 may conduct current such as AC current when cooled below the critical temperature for the superconductor material that makes up the superconductor strips 308, provided that the AC current conducted by the superconductor tape 300 is below the critical current $J_C$ for transforming the superconductor material of the superconductor tape 300 into a non-superconducting state.

As discussed below, the superconductor strips 308 are characterized by a strip width $d_S$ that is defined by the width of the conductive strip 306 formed upon the superconductor layer 304. Because the strip width $d_S$ of the superconductor strips 308 is less than the tape width $d_{TAPE}$ of the superconductor tape 300, the aspect ratio t/d where d is either $d_{TAPE}$ or $d_S$, may be substantially less than in a conventional tape in which the superconductor layer spans the width $d_{TAPE}$ of the tape. Accordingly, in normal operation conditions where the AC current is less than $J_C$ the AC current is conducted with lower AC loss due to the reduced magnetic hysteresis resulting from the lower aspect ratio t/d for superconductor tape 300 as compared to a tape having a single superconductor layer that spans the tape width $d_{TAPE}$.

Under fault conditions, the AC current exceeds $J_C$ and causes the superconductor strips 308 to transition to a non-superconducting state in which resistance is sufficient in the superconductor strips 308 (temporarily in a non-superconducting state) that most current is temporarily conducted through the conductive strips 306.

As further illustrated in FIGS. 3A and 3B the non-superconducting strips 310 are disposed adjacent the inter-strip regions 316 defined between the conductive strips 306. As detailed below, the non-superconducting strips 310 are formed to define the superconductor strips 308 by a simplified process that is compatible with high volume manufacturing.

FIGS. 6A-6D depict four different stages of fabrication of a superconductor tape according to an embodiment of the disclosure. At one stage of fabrication shown in FIG. 6A a substrate 302 is provided. As noted previously, the substrate 302 may comprise multiple layers. In some embodiments, a base layer is a metal alloy such as a nickel based alloy material. Additional layers may include oxide layers as discussed, for example, with respect to FIGS. 5A and 5B.

Each subsequent stage of processing may be carried out in a manner consistent with high volume manufacturing may be performed to process the superconductor tape structure. At a subsequent stage of fabrication depicted at FIG. 6B, a superconductor layer 602 is formed upon the substrate 302. The superconductor layer 602 may be formed by known techniques including metal organic deposition (MOD), metal organic chemical vapor deposition (MOCVD), or other convenient technique. In various embodiments, the thickness of the superconductor layer may range between about 0.5 µm and about 2 µm. Suitable material for the superconductor layer include YBCO based material as well as bismuth strontium calcium copper oxide materials which can be represented by the general formula $Bi_2Sr_2Ca_{n-}Cu_nO_{4+2n+x}$. The embodiments are not limited in this context.

Figure 6A:
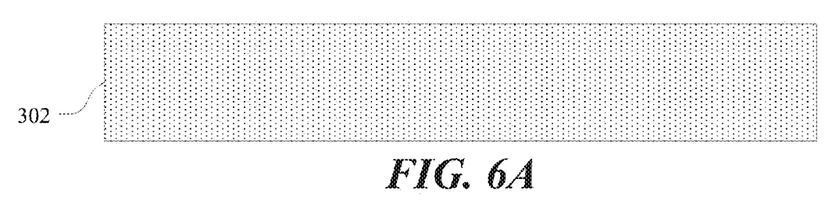
FIG. 6A depicts a first stage of an embodiment for fabrication of a superconductor tape.
Figure 6B:
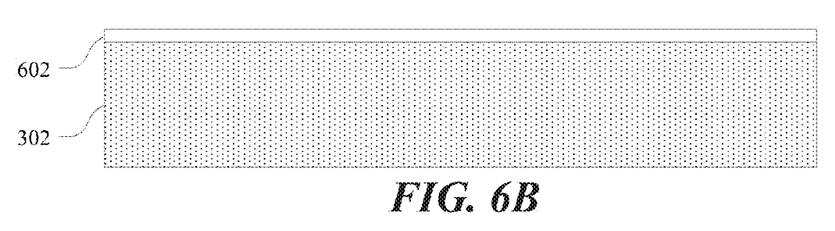
FIG. 6B depicts a second stage of an embodiment for fabrication of a superconductor tape.
Figure 6C:
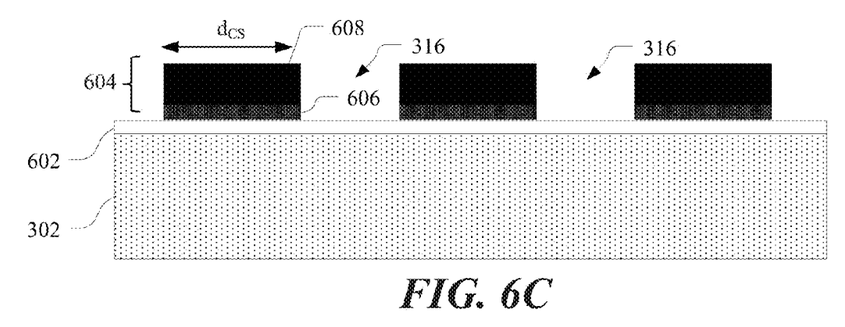
FIG. 6C depicts a third stage of an embodiment for fabrication of a superconductor tape.

Subsequent to formation of the superconductor layer 602, FIG. 6C depicts the formation of strips 604 upon the superconductor layer 602. In some embodiments, the strips 604 are formed by a screen printing process. In other embodiments, the strips 604 are formed by extrusion printing. In various embodiments, the total thickness of the strips 604 may range up to about 30 µm, while the width $d_{CS}$ of the strips 604 ranges between about 20 µm and 50 µm. As discussed previously, the strips 604 may contain multiple different layers, such as an underlayer 606 and layer 608. In one example the strip 604 includes an underlayer 606 made of silver that is deposited as a paste or other silver-containing medium to directly contact the superconductor layer 602. The strip 604 may also include a layer 608 that is a copper containing layer that is separated from the superconductor layer 602 by the underlayer 606. The printed or extruded strips 604 may be subsequently subject to thermal treatment to form the conductive strips 306 of FIG. 3A. For example the strips 604 may be in a metal paste form that includes various solvents and binders that are removed when subject to thermal treatment, leaving a residual metallic conductive strip 306. As illustrated, after formation, the strips 604 define the aforementioned inter-strip regions 316.

Figure 6D:
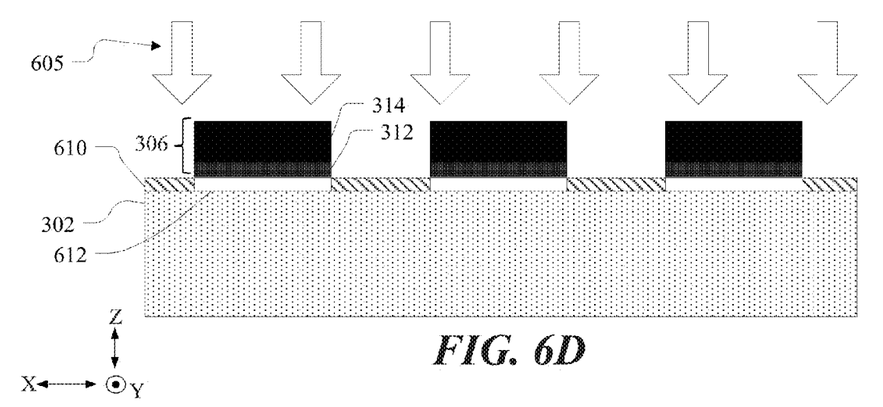
FIG. 6D depicts a fourth stage of an embodiment for fabrication of a superconductor tape.

FIG. 6D depicts another stage of fabrication of a superconducting tape that takes place subsequently to the stage illustrated in FIG. 6C. As illustrated, the substrate 302 with conductive strips 306 in place is subject to energetic treatment 605, which is represented schematically by the arrows shown. The energetic treatment 605 may include, for example, any combination of heat treatment, ion treatment, and gas phase treatment that is effective to selectively alter exposed regions 610 of the superconductor layer 602 that are adjacent the inter-strip regions 316 and are therefore not covered by the conductive strips 306. The alteration of the exposed regions 610 renders them into non-superconductor material that defines the superconductor strips 308 (612).

As a result of the processes illustrated in FIGS. 6A-6D a superconductor tape, such as the superconductor tape 300 of FIG. 3A may be fabricated with a series of superconductor strips that each present a smaller aspect ratio t/d than a conventional superconductor tape can be fabricated. An advantage of this technique is that it does not require removal of superconductor tape materials such as the conductive material deposited on the superconductor layer as well as the superconductor layer. In a previous scheme that has been proposed to pattern narrower structures in superconductor tapes, patterning takes place after depositing a blanket metal overlayer on a superconductor layer over the entire tape surface. In the previous scheme an etch pattern is defined on top of the superconductor tape, followed by etching of the metal overlayer, which may be several tens of micrometers thick. Subsequently, to define patterned superconductor features, the superconductor layer is etched through its entire thickness. In contrast, in the present embodiments, no etching need be performed after the conductive strips 306 are formed.

Moreover, the use of deposition processes such as screen printing or extrusion printing facilitates formation of an array of superconductor strips that are closely spaced even for narrow strip widths in order to maximize $J_C$ under normal operating conditions. For example, in one specific embodiment, conductive strips having a width of 50 μm may be printed with a spacing between conductive strips of about 10 μm, yielding strip width and spacing of similar dimensions in the underlying superconductor layer.

In addition, the energetic treatment to form non-superconductor strips (and thereby define the adjacent superconductor strips) may take place in various apparatus suitable for high volume manufacturing including furnace annealing apparatus, plasma chamber or reactive gas chamber, or ion implantation apparatus. The embodiments are not limited in this context.

Figure 7:
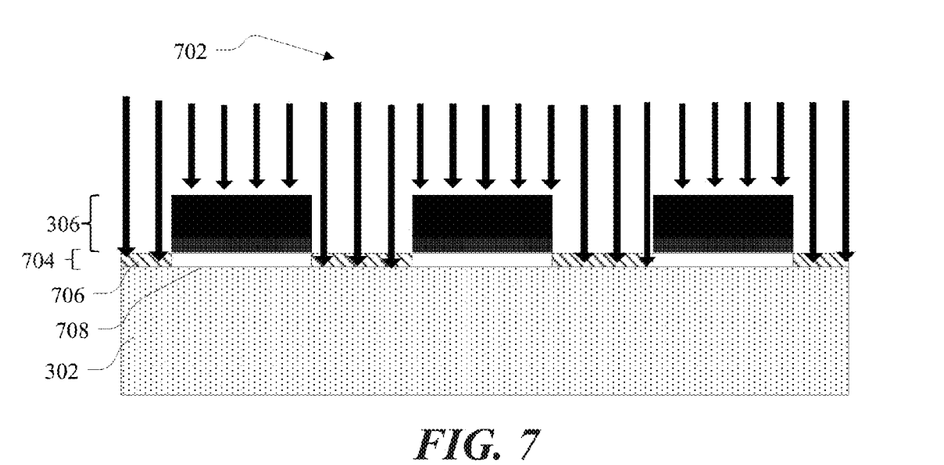
FIG. 7 depicts one variant for formation of isolated superconducting strips in a superconductor tape.

FIG. 7 depicts one variant of the energetic treatment 605 in which ions 702 are directed toward a superconductor tape after a superconductor layer 704 is formed on the substrate 302, and conductive strips 306 formed on the superconductor layer 704. The ions 702 are provided as an ion species and in an ion dose and ion energy that is effective to render the superconductor layer 704 into a non-superconducting material in exposed regions 706 that are not covered by the conductive strips 306. For example nitrogen, boron or other low atomic weight ions may implant to depths of about 0.5 μm to 1 μm for ion energies in the range of 300 kV to 1 meV. Concomitant damage to superconductor material implanted with such ions may extend to greater depths such as about 1-2 μm. Accordingly, for superconductor tapes having a superconductor layer thickness in the range of 0.5-2 μm the process depicted in FIG. 7 may be conveniently performed in a medium energy or high energy beamline ion implantation apparatus in some embodiments. It is to be noted that for a high temperature superconductor material such as $YBa_2Cu_3O_{7-x}$ the material in exposed regions 706 need not be amorphized in order for those regions to be rendered as non-superconductor material. This is because the superconductivity properties are particularly sensitive to changes in the crystalline structure and stochiometry of the YBCO material.

Advantageously, the regions 708 disposed underneath conductive strips 306 are screened from any damage from the ions 702 inasmuch as the thickness of the conductive strips 306 may be on the order of 20 μm. Accordingly, a relatively small upper portion of the conductive strips 306 may be altered by implantation of ions 702. Moreover, even an ion dose sufficient to transform the exposed regions 706 into a non-superconducting material may increase electrical resistivity just in the implanted portions of the conductive strips 306 resulting in a marginal increase in overall electrical resistance of the conductive strips 306.

Figure 8:
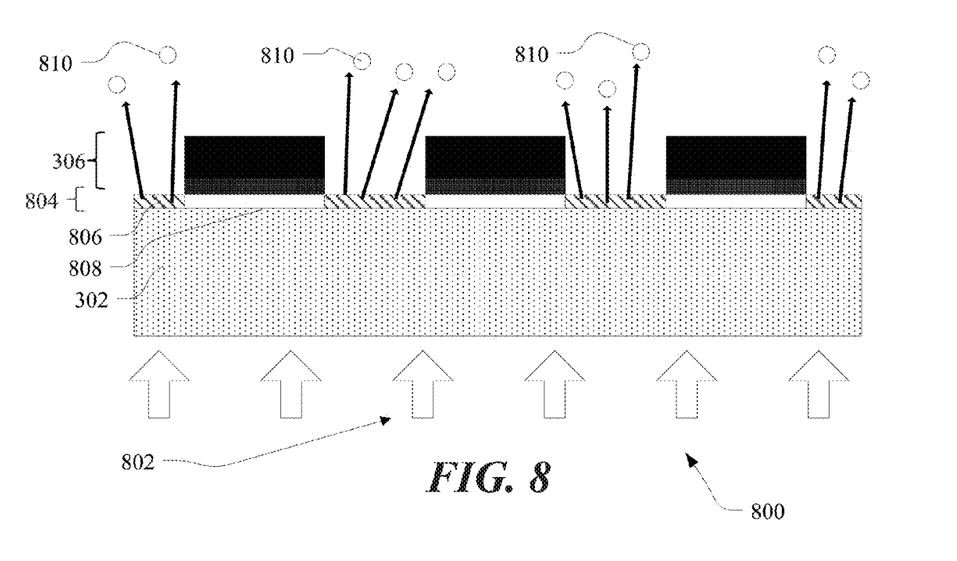
FIG. 8 depicts another variant for formation of isolated superconducting strips in a superconductor tape.

FIG. 8 depicts another variant of the energetic treatment 605 in which heat flux 802 is directed toward a superconductor tape 800 after a superconductor layer 804 is formed on the substrate 302, and conductive strips 306 formed on the superconductor layer 804. The heat flux may be in the form of conductive heating, convective heating or radiative heating or any combination thereof. In some embodiments the superconductor layer 804 is $RBa_2Cu_3O_{7-x}$ where R is a rare earth element. Such materials exhibit a strong dependence of superconductivity on oxygen stochiometry such that lower the oxygen content causes the material to exhibit poorer superconductivity or no superconductivity. In addition, oxygen mobility in such structures is relatively high such that heating under certain conditions may generate the release of oxygen, thereby reducing the oxygen content within the crystalline structure. Accordingly, the heat flux 802 may be provided to deplete oxygen from $RBa_2Cu_3O_{7-x}$ material that is disposed in exposed regions 806 that are not covered with the conductive strips 306.

The heating of superconductive tape 800 may be tailored such that exposed regions 806 become sufficiently depleted of oxygen to be rendered non-superconducting while regions 808, which are protected by the conductive strips 306, remain superconductive. For example, in the prototype $YBa_2Cu_3O_{7-x}$ the material exhibits an orthorhombic structure at room temperature and becomes superconducting at low temperature for values of x between 0 and about 0.20. At higher values of x the $YBa_2Cu_3O_{7-x}$ material no longer is superconductive while at values of x above about 0.5 the $YBa_2Cu_3O_{7-x}$ is tetragonal at room temperature. Accordingly, heating may be arranged to outdiffuse oxygen species 810 to deplete $YBa_2Cu_3O_7$ material disposed in exposed regions 806 of about 0.2 mole fraction of oxygen or more, while leaving $YBa_2Cu_3O_7$ material disposed in regions 808 substantially fully oxygenated, that is, where the value of x remains at zero or less than about 0.05.

Figure 9:
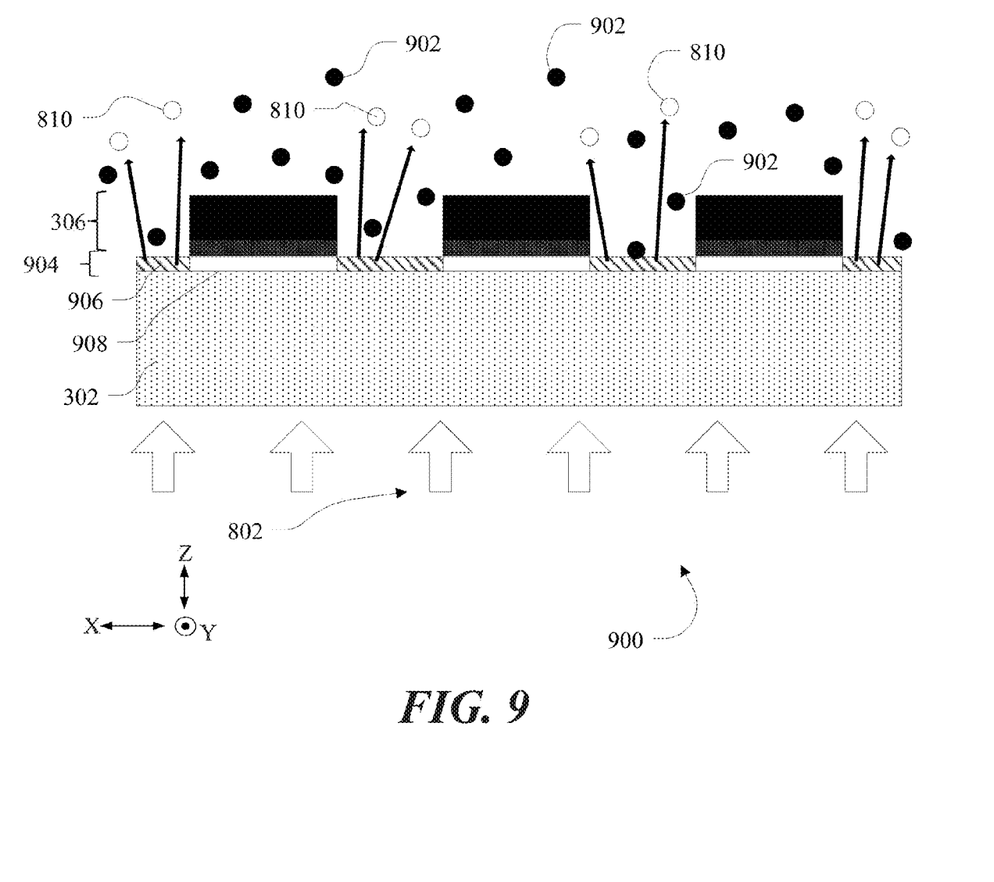
FIG. 9 depicts a further variant for formation of isolated superconducting strips in a superconductor tape.

In one embodiment, the heating of superconductor tape 800 may be performed in vacuum at elevated temperatures such as at 300° C. or greater. However in other embodiments an ambient may be provided that includes reducing gases to effect removal of oxygen as shown in FIG. 9. As shown therein, while heat flux 802 is provided, an ambient containing gas species 902 is supplied to the superconductor tape 900 to react with superconductor material of the superconductor layer 904 disposed in exposed regions 906, causing the release of oxygen species 810. This causes the exposed regions 906 to become non-superconductive while leaving the regions 908 as superconductive material. In various embodiments, the gas species 902 may be provided as forming gas ($N_2/H_2$ mixture) or alternative in an $NH_3$ plasma. The embodiments are not limited in this context.

Although the disclosed embodiments detail formation of a superconductor tape containing multiple superconductor strips and non-superconductor strips, in other embodiments a superconductor tape may be defined by a single superconductor strip and single non-superconductor strip. In order to form such a structure a single metal layer may be used to mask a portion of an underlying superconductor tape such that the exposed portion of the superconductor tape is rendered into a non-superconductor strip. In further embodiments, a superconductor tape may include a single superconductor strip and multiple non-superconductor strips or multiple superconductor strips and a single non-superconductor strip. The embodiments are not limited in this context.

In summary, the present embodiments provide techniques and structure for superconductor tapes that provide multiple advantages over conventional superconductor tapes. By using deposited conductive strips to define in an underlying superconductor layer superconductor strips having smaller width than the superconductor tape width, the aspect ratio of superconducting structures is reduced, thereby decreasing magnetic hysteresis and AC loss when the superconductor tape transmits AC current. Moreover, the use of printing techniques to form conductive strips provides a manufacturable approach to defining larger aspect ratio superconductor structures in a superconductor tape. In particular, etch processes are avoided, which save process time and materials cost, which may result in considerable cost reduction for superconductor tape technology that employ high cost materials such as silver.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A superconductor tape, comprising:
a plurality of conductive strips having respective long directions parallel to a long tape direction of the superconductor tape, each of the plurality of conductive strips separated from one another by a inter-strip region, the plurality of conductive strips having a conductive strip width;
a superconductor layer disposed adjacent the plurality of conductive strips, having a length along the long tape direction; and
the superconductor layer comprising:
a plurality of superconductor strips disposed under the respective plurality of conductive strips, the plurality of superconductor strips having a superconductor strip width $d_s$ defined by the conductive strip width; and
a non-superconductor strip disposed adjacent the inter-strip region, the non-superconductor strip comprising a an exposed portion of the superconductor layer not covered by another material, wherein the plurality of superconductor strips have a composition given by $RBa_2Cu_3O_{7-x}$ where R is a rare earth element, wherein x is less than 0.05, and wherein the non-superconductor strip has a composition given by $RBa_2Cu_3O_{7-x}$ where x is greater than 0.2.

2. The superconductor tape of claim 1, further comprising a metal alloy layer disposed under the superconductor layer.

3. The superconductor tape of claim 2, further comprising a plurality of oxide layers disposed between the metal alloy layer and superconductor layer.

4. The superconductor tape of claim 1, wherein the superconductor layer comprising $RBa_2Cu_3O_{7-x}$ where R is a rare earth element.

5. The superconductor tape of claim 1, wherein the conductive strips comprise a copper layer/silver layer bilayer structure having a thickness of 5 μm to 60 μm.

6. The superconductor tape of claim 1 further comprising a tape width in a direction perpendicular to the long tape direction of 0.5 cm to 5 cm, the conductive strips further comprising a strip width of 20 μm to 500 μm in the direction perpendicular to the long tape direction.

7. The superconductor tape of claim 1, wherein the non-superconductor strip comprises $RBa_2Cu_3O_{7-x}$ where R is a rare earth element and x is greater than 0.3.

8. The superconductor tape of claim 1, wherein the plurality of superconductor strips comprise a first material arranged in a crystalline structure, and the non-superconductor strip comprises the first material wherein the crystalline structure is damaged.

9. A superconductor tape, comprising:
a conductive region, the conductive region comprising a conductive strip having a conductive strip width; and
a superconductor layer disposed adjacent the conductive region, the superconductor layer having a superconductor region disposed under the respective conductive region, the superconductor region comprising a superconductor strip having a superconductor strip width $d_s$ defined by the conductive strip width,
and a non-superconductor region disposed adjacent the superconductor region, the non- superconductor region comprising an exposed portion of the superconductor layer not covered by another material wherein the superconductor region has a composition given by $RBa_2Cu_3O_{7-x}$ where R is a rare earth element, wherein x is less than 0.05, and wherein the non-superconductor region has a composition given by $RBa_2Cu_3O_{7-x}$ where x is greater than 0.2.

10. The superconductor tape of claim 9, wherein the conductive region is a plurality of conductive regions comprising a plurality of conductive strips, wherein the superconductor region is a plurality of superconductive regions comprising a plurality of superconductor strips each disposed under a respective conductive strip.

* * * * *